United States Patent [19]

LeFever et al.

[11] 4,345,895
[45] Aug. 24, 1982

[54] PHOTOFLASH DEVICE HAVING DIE-STAMPED CIRCUIT BOARD ASSEMBLY WITH FLEXURE MEANS TO PREVENT SWITCH CUTTING

[75] Inventors: Randall H. LeFever; Boyd G. Brower, both of Williamsport, Pa.

[73] Assignee: GTE Products Corporation, Stamford, Conn.

[21] Appl. No.: 131,610

[22] Filed: Mar. 19, 1980

[51] Int. Cl.³ ............................................. F21K 5/02
[52] U.S. Cl. .................................... 431/359; 362/13
[58] Field of Search ................. 431/359; 362/6, 13, 362/14, 15

[56] References Cited

U.S. PATENT DOCUMENTS

| | | | |
|---|---|---|---|
| 3,857,667 | 12/1974 | Vetere | 431/359 |
| 3,911,716 | 10/1975 | Weglin | 72/324 |
| 3,990,142 | 11/1976 | Weglin | 29/625 |
| 4,017,728 | 4/1977 | Audesse et al. | 431/359 |
| 4,113,424 | 9/1978 | Armstrong et al. | 362/13 |
| 4,152,751 | 5/1979 | Sindlinger et al. | 362/13 |
| 4,164,007 | 8/1979 | Audesse et al. | 362/13 |

*Primary Examiner*—Carroll B. Dority, Jr.
*Attorney, Agent, or Firm*—Lawrence R. Fraley

[57] ABSTRACT

A photoflash device circuit board assembly including a dielectric substrate, switching element, and conductive member. The switching element and conductive member are pressed (e.g., die-stamped) within the substrate. The substrate is provided with a flexure means to permit it to flex during pressing such that the switching element will not be severed. A photoflash device including the circuit board assembly and a light-transmitting housing and an electrically activated flashlamp is also described.

24 Claims, 7 Drawing Figures

PHOTOFLASH DEVICE HAVING DIE-STAMPED CIRCUIT BOARD ASSEMBLY WITH FLEXURE MEANS TO PREVENT SWITCH CUTTING

TECHNICAL FIELD

The invention relates to electrically-activated, disposable photoflash devices and particularly to the circuit board assemblies utilized therein.

BACKGROUND

Photoflash devices of the variety mentioned above typically include a circuit board having an insulative substrate with preestablished circuit pattern or "runs" thereon. Electrically connected at designated locations to this circuitry are a plurality (e.g., eight or ten) of high voltage flashlamps. The circuit board, with flashlamps secured thereto, is located within a suitable, insulative housing having a light-transmitting cover (to permit the high intensity output from each flashlamp to pass therethrough) and at least one connector tab for attaching the device to a respective camera and electrically connecting the circuit board's circuitry to the power source (e.g. piezoelectric element) typically located therein. Activation of the power source by the camera's user, such as by depressing the shutter release button, results in a firing pulse being provided the circuitry and ignition of one of the device's flashlamps. One type of device containing a pair of opposing linear arrays of flashlamps and a singular, common connector tab is referred to in the art as a "flash bar," while another type, which is capable of being inverted and thus possessing two opposing connector tabs, is referred to as a "flip-flash." The "flip-flash" devices were designed primarily to substantially eliminate the photographic phenomenon known as "red-eye," which occurs when light is reflected by the retinae of subjects' eyes onto the photographic film to indicate the eyes' pupils as being red. These latter devices substantially eliminate this possibility by spacing the illuminating flashlamp a specified distance from the camera's lens.

One example of the aforementioned "flash bar" photoflash device is described in U.S. Pat. No. 3,857,667 (J. J. Vetere et al.). An example of an eight flashlamp arrayed "flip flash" is described in U.S. Pat. No. 4,113,424 (D. E. Armstrong et al.), while examples of ten lamp versions of this product are described in U.S. Pat. Nos. 4,152,751 (R. E. Sindlinger et al.) and 4,164,007 (E. G. Audesse et al.). All of the above patents are assigned to the assignee of the instant invention.

As stated, the present invention is concerned with photoflash devices and the circuit board assemblies which eventually form an integral part of the final photoflash product. One example of a known technique for making such components (e.g., those used in the aforedescribed "flash bar" device) has been to silk-screen a silver-containing material over a ceramic-coated steel board and thereafter oven-fire the assembly to fuse the silver particles to a continuous conductor. The steel board was originally blanked from a strip of said material, sprayed or dipped with the ceramic, and fired to produce a hardened coating thereon. Silk-screening and oven-firing followed. Another type of technique (e.g., for those components used in many "flip-flash" devices) also involved silk-screening of silver-containing material but instead on a styrene copolymer, thermoplastic substrate (or board). The silver-containing material, applied in paste form, was then subjected to either a radiation curing or hot air drying step. In both of the above examples, the cured silver-coating material served as the conductive circuit in the finished device. Yet another technique (as used in at least one embodiment of a "flip-flash" device) involved approximately the same procedures as used to manufacture circuit board assemblies in such products as television sets. This process required several steps, including photoresist coating a copper-clad sheet of phenolic or other suitable base material and thereafter chemically removing (e.g., etching) the undesired copper. This component was then thoroughly cleaned and coated with a protective film.

The aforementioned techniques and resulting products contain several disadvantages. Silk-screening, for example, requires utilization of pastes which in turn are comprised of discrete silver particles located therein and separated by a binder. Although these pastes are eventually subject to some form of heat treatment to hopefully fuse said particles, the finished circuitry understandably is limited in its conductivity (and thus possesses an inherently higher resistance) in comparison to conductors presented in another state. Silk-screened circuitry is also susceptible to containment of discontinuities as might result from dust or lint interference during the screening operation. The presence of a screened silver layer also poses a problem when the chosen method for securing the device's flashlamps to the circuitry is soldering. Occasionally, the silver layer has prevented proper wetting during this process. Still another inherent problem with silk-screening conductive circuitry is the ready opportunity for dimensional impreciseness due to the horizontal flow (beneath the screen) as the paste is forced through the screen's pattern. In addition, occasional smearing of the circuit run is practically unavoidable. The latter problems are particularly troublesome to devices employing high voltage flashlamps in that sparkover can then occur between the circuit's elements, resulting in either product failure or simultaneous flashing of two or more lamps. A final disadvantage of the above processes is the relatively high costs associated therewith. Techniques using photoresist coating, development, and subsequent chemical removal are understandably costly in terms of both time and material. Silk-screening is also understandably costly, particularly as a result of using the precious metal silver and the relatively rapid wear of the screen materials typically used in this process.

The present invention overcomes the several, aforementioned disadvantages associated with known photoflash devices by teaching a device and circuit board assembly for use therein wherein die-stamping is utilized to define and position the device's circuitry on its dielectric substrate. Accordingly, the invention can be readily produced without the need for photo-resists, chemical echtants, precious metals, etc. In addition to this, and of equal or greater significance, the device's circuit runs or paths can be satisfactorily positioned and electrically connected to other elements which also constitute part of the device's circuitry without having damage caused thereto. One primary example of such an element as utilized in today's more recent products is a radiation sensitive switch which is usually electrically connected in series with a respective flashlamp and adapted for receiving the radiant energy from the lamp upon ignition thereof. The switch will thus melt or shrink to define an open circuit almost instantaneously after flashlamp ignition and thereby permit reliable flashing of the subsequent lamps in the device's array in rapid succession. An example of a radiation sensitive switch is described in U.S. Pat. No. 4,017,728 (E. G. Audesse et al.), which is also assigned to the assignee of the present invention. As described therein, these switches are each typically comprised of a thin strip of polymeric material attached to the circuit board across a respective aperture provided therein. A typical ten-lamp array will include eight switches of this variety in view of the obvious understanding that the last fired lamp on each end of the array has no need for such an element. It is understood that the relatively delicate nature of such elements as radiation sensitive switches does not readily permit electrical connection thereto by a technique as relatively severe and demanding as die-stamping. Die-stamping has been utilized in the production of printed circuit components for use in other types of products than those described above but only because such components (and therefore products) did not require elements such as radiation sensitive switches therein. Typically, these products consisted of only a base member, a solid metal conductor (e.g., copper foil), and a binding adhesive. See, e.g., U.S. Pat. Nos. 3,911,716 (W. Weglin) and 3,990,142 (W. Weglin). The invention as will be described is this deemed all the more unique and significant in that it not only provides a product wherein positive electrical connection is assured between the component's circuit runs and delicate switch elements but also where definition and securement of the circuit runs to the insulative substrate which forms an integral part of the final product is possible without harm to the circuit's switches. There is described in a copending application filed concurrently herewith under Ser. No. 131,711, filed Mar. 19, 1980, a circuit board assembly and method of making wherein die-stamping is used to secure at least one conductive member and switching element within a dielectric substrate. It will be understood from the following description that the circuit board assembly and photoflash device manufactured in accordance with the teachings of the instant invention represents a significant improvement over the invention of application Ser. No. 131,711, filed Mar. 19, 1980.

It is believed therefore that a photoflash device and circuit board assembly made in accordance with the techniques defined herein will constitute significant advancements in the photoflash art.

DISCLOSURE OF THE INVENTION

It is therefore a primary object of the present invention to enhance the art of electrically activated photoflash products by providing a photoflash device made in accordance with the principles cited above.

It is another object of the present invention to provide a circuit board assembly for utilization within such a device.

In accordance with one aspect of the invention, there is provided a circuit board assembly for use within a photoflash device. The assembly includes a dielectric substrate, a switching element located on the substrate and having part thereof pressed within the substrate. An electrically conductive member is also pressed within the substrate such that part of said member is located atop and in electrical contact with the pressed part of the switching element. The circuit board assembly further includes a flexure means (within or forming a part of the dielectric substrate) which permits the dielectric substrate to flex during pressing of the conductive member and switching element in order that severance of the switching element does not occur.

In accordance with another aspect of the invention, there is provided a photoflash device which includes a circuit board assembly having the features defined above. The device further includes a light-transmitting housing (wherein the circuit board assembly is located) and at least one electrically-activated flashlamp also located within the housing and electrically connected to the switching element. The flashlamp emits high intensity light through the light-transmitting housing upon ignition thereof.

BEST MODE FOR CARRYING OUT THE INVENTION

For a better understanding of the present invention together with other and further objects, advantages and capabilities thereof, reference is made to the following disclosure and appended claims in connection with the above described drawings.

Figure 1:
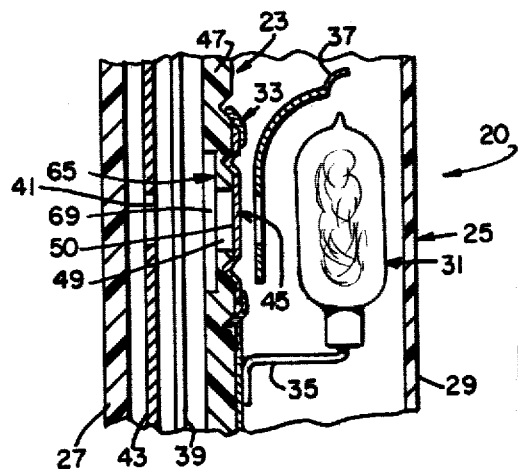
FIG. 1 is a partial elevational view, in section, of a photoflash device in accordance with a preferred embodiment of the invention.

With particular reference to FIG. 1, there is illustrated a partial elevational view of an electrically-activated photoflash device 20 in accordance with a preferred embodiment of the invention. Device 20 includes a circuit board assembly 23 located within a plastic housing 25 with rear and forward members 27 and 29, respectively. These two members may be secured together, e.g., using cement, or it is also possible to produce the entire housing from a single member of such material. Forward member 29 is light-transmitting to permit light emitted from each of the several flashlamps 31 (only one shown) to pass therethrough upon lamp ignition. Ignition is achieved when the device's connector tab or tabs (not shown) located on the end(s) of housing 25 are inserted within the socket of the camera (not shown) used therewith and the camera's shutter release button activated. A suitable firing pulse is produced by the camera's power source (e.g., piezoelectric element) and passed to the respective lamp 31 via the connection provided at the connection tab. This pulse travels up through the device's circuitry (runs) 33 which forms part of assembly 23. As shown in FIG. 1, the two conductive lead-in wires 35 (only one shown) of lamp 31 are connected to circuitry 33, said means of connection accomplished by such methods as soldering or crimping (e.g. using metal eyelets). Photoflash device 20 may also include a reflector 37 for promoting forward light output. Reflector 37 is preferably of aluminum-coated plastic and located immediately behind lamp 31. Device 20 may further include a sheet of flash-indicating material 39 (e.g., biaxially oriented polypropylene) which shrinks or melts when exposed to heat from lamp 31 (through a pair of aligned apertures within reflector 37 and the substrate or board component of assembly 23) to thereby change the color viewable through the openings 41 (one shown) provided in an indicia sheet 43 (also optional). A user of the device is thus provided with a ready means of ascertaining whether or not a particular lamp or group of lamps has been flashed. Understandably, rear member 27 of the device's housing is also light-transmitting to permit viewing in the manner defined. Sheet 43 may be of paper or thin cardboard.

It is understood that photoflash devices containing many of the above components (excluding of course a circuit board assembly possessing the unique features defined herein) are known in the art, with examples of such being described in detail, for example, in the aforementioned patents. As also stated, it is further known in the art to incorporate radiation sensitive switches as an important element of such devices. Reference is again directed to assignee's U.S. Pat. No. 4,017,728. These elements, represented generally as numeral 45 in FIG. 1, are also referred to in the art as radiant-energy-activated switches, quick-disconnected switches, etc, and typically comprise a length (strip) of electrically conductive, heat shrinkable polymeric material attached to the device's board member across a respective aperture 49 (see also FIG. 2 below). The switch, being attached at its opposing ends, has its mid portion spatially suspended to avoid physical contact with the heat-absorbing surfaces of the circuit board. This arrangement maximizes the speed with which shrinking and separation of the mid portion occurs upon receipt of heat from adjacent lamp 31. As shown, lamp 31 (via lead-in wires 35) and switch 45 are electrically connected in series to assure proper connection between the aforedescribed power source and remaining, unfired lamps which also form part of device 20. This mode of operation is described in the aforementioned U.S. Pat. No. 4,017,728 and further detail is not believed necessary.

Switch 45 comprises a thin strip 50 of plastic preferably fabricated from a mono- or biaxially oriented polyethylene, polypropylene, polystyrene, polyester, or nylon. The polymeric material itself may be made conductive by additives such as carbons or it may be rendered surface conductive by the deposition of a suitable conductive layer (e.g., aluminum) thereon. The performance of highly reflective materials, such as aluminized polypropylene, can be enhanced by applying a coating or spot (not shown) of dark, light-absorbing material (e.g. ink) on the surface of the switch which faces lamp 31 and lies adjacent thereto (separated of course by only the apertured reflector 37).

As understood from the foregoing, it is essential that the opposing ends of switch 45 not only be properly secured to the board or substrate member 47 which constitutes a key element of assembly 23, but these also must be electically connected to respective, designated parts of circuitry 33. When using the aforementioned technique of silk-screening, this electrical connection was achieved by carrying the circuit pattern over the ends of the switch's strip. This procedure thus resulted an additional use of the exspensive, silver-containing conductive material, yet another disadvantage added to the several cited above. In some prior devices, switch 45 was secured to board 47 using an adhesive tape with pressure thereafter applied to hopefully provide securement. This procedure did not prove altogether satisfactory, however, in that the strip was occasionally removed from the board during subsequent processes to which this product was subjected. In the technique defined in copending application under Ser. No. 131,711, filed Mar. 19, 1980, it is essential that the material comprising the dielectric substrate be sufficiently soft (lack hardness) during the initial stages of die-stamping in order that switch cutting is prevented. While this has proven satisfactory, a disadvantage does exist in that the materials usable for the substrate are limited. The present invention overcomes this disadvantage by permitting utilization of harder substrate material which, in many cases, are also less expensive than the softer varieties. Understandably, the invention is also readily capable of using these softer materials with electrical connection, securement, and avoidance of switch cutting being even more assured. It was also determined in the technique described in application Ser. No. 131,711, filed Mar. 19, 1980 that the farther from the substrate's aperture(s) the die embedded the substrate, the greater the opportunity for severance or deformation to the switching element. In other words, it was often necessary to die-stamp immediately adjacent the bridged apertures. The invention defined herein substantially removes this requirement and permits die-substrate engagement at greater distances from the substrate's aperture. It is therefore possible to utilize switches possessing greater lengths and/or of more varied configurations, or to produce substrates wherein smaller apertures are used, or combinations of the two.

Figure 2:
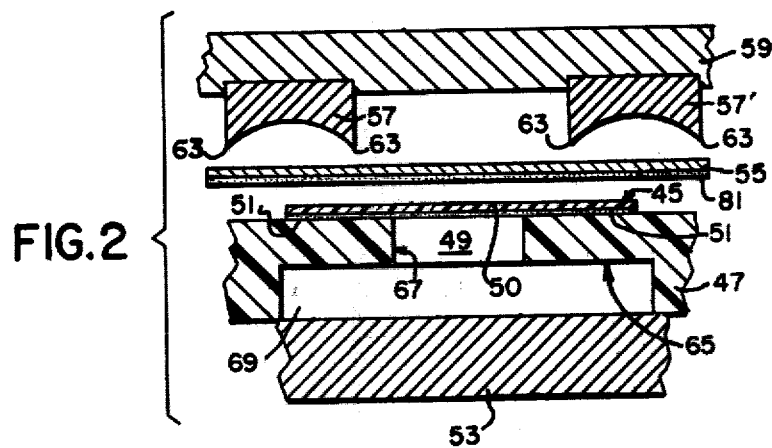
FIGS. 2 and 3 represent the steps of producing a circuit board assembly in accordance with a preferred embodiment of the invention.
Figure 3:
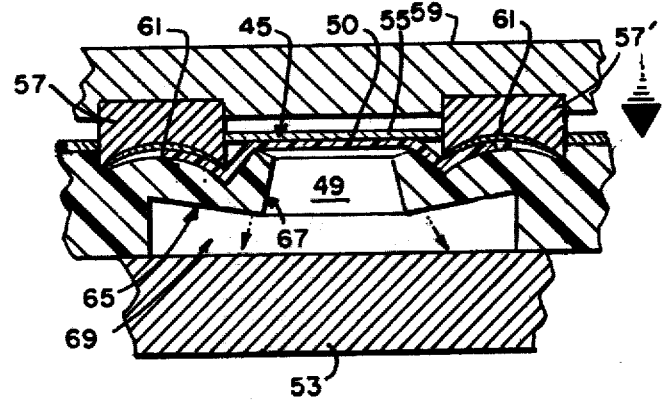

In accordance with the teachings of the present invention, switching element 45 and the conductive members 61 which form part of the overall circuitry for the finished circuit board assembly 23 are securedly positioned on the assembly's dielectric substrate 47 using a die-stamping process. The unique, end result of this process is that the conductive members are secured and electrically connected to the conductive switch element, which is also positively secured, without severing the switching element. With particular reference to FIGS. 2 and 3, there are shown the various steps of producing assembly 23 in order to achieve this result.

In FIG. 2, switching element 45, preferably comprised of the polyester Mylar having a conductive (aluminum) layer thereon, is positioned above substrate 47 so as to align with an aperture 49 located within the substrate. The aluminum conductive layer (not shown) is understandably located along the upper surface of the Mylar. Aperture 49 in the finished product (device 20) permits radiant energy from flashlamp 31 to pass therethrough to the aforedescribed indicia sheet 43. Aperture 49 also serves to assure that a major portion of element 45 will not physically contact the upper surface of substrate 47. Such a surface, being heat-absorbing, could serve to reduce the operational effectiveness of element 45 during exposure thereof to the intense energy from flashlamp 31. Accordingly, element 45 is located on substrate 47 so as to bridge aperture 49. Initial attachment of element 45 is achieved by providing a quantity of adhesive 51 at both ends of the striplike element. Adhesive 51, preferably of the pressure-sensitive variety, may be applied using any of the techniques well known in the art. The element 45 and adhesive are located on substrate 47 and a suitable pressure (sufficient to activate adhesive 51 and form a bond between the substrate and element at these locations) is applied downwardly on the element's upper surface. A roller or similar member can be used as the pressure applicator. The combined substrate and element members are next positioned on a base or platen 53 which forms part of the larger die-stamping machine. Base 53 preferably includes a recessed portion or cavity (not shown) therein to better accommodate substrate 47, the substrate being positioned within said cavity. A thin strip of conductive material 55 is then oriented above the substrate 47 in the manner shown, and then lowered to substantially cover both substrate and switching element. Material 55 is dead soft aluminum, having a thickness of about 0.002 inch. Once in position, the aluminum strip is engaged by two dies 57 and 57' which are each secured or form part of an upper platen 59 of the machine. Platen 59 and dies 57 and 57' are preferably both comprised of steel (e.g., low carbon). The upper platen is lowered mechanically to effect said engagement with the positioned strip 55. Downward force is further applied by dies 57 and 57' until preselected portions 61 of strip 55 and switching element 45 are pressed an established distance into substrate 47 (FIG. 3). A total force within the range of about 250 to 350 pounds per linear inch of cutting edge (of dies 57, 57') is applied using the materials and thicknesses described herein. Portions 61, once secured within substrate 47, are understood to comprise part of the circuitry 33 depicted in FIG. 1.

As shown in the drawings, one side of switch 45 is electrically connected (via a conductive member) to the lead-in wires 35 projecting from flashlamp 31. In the orientation represented in FIGS. 2 and 3, the preferred side is that one to the right (under die 57'). Connection is assured by utilization of parallel cutting edges 63 on each die to thus not sever part of the conductive strip 55 but instead permit this part to remain attached to the embedded portion 61. With regard to FIG. 4, this non-severed part of the circuitry is not shown because it projects from portion 61 in a direction perpendicular to the drawing (either toward the viewer or behind portion 61 and therefore away from the viewer). As shown in FIG. 1, this part lies along the surface of substrate 47 to and beyond the point of physically contacting lead-in wires 35.

Figure 4:
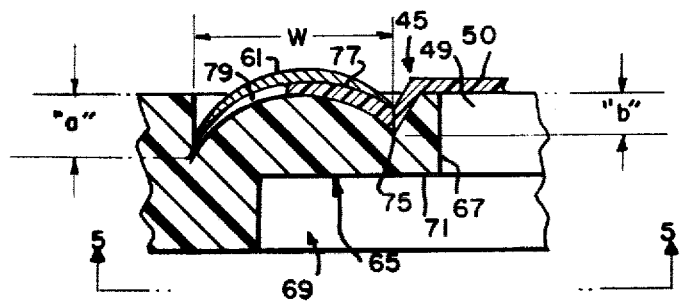
FIG. 4 is a partial enlarged elevational view, in section, of the circuit board assembly of the invention showing the pressed conductive member and switching element.

In accordance with further teachings of the invention, the circuit board assembly's substrate includes flexure means 65 located therein or forming a part thereof. Means 65 comprises at least one portion 67 of reduced thickness within substrate 47 which, in the embodiment depicted in FIGS. 2-5, is located adjacent and substantially surrounds aperture 49. Portion 67 is designed to flex (or yield) during the embedding of dies 57 and 57' therein so as to permit use of relatively hard substrate materials without substantial deformation or severance of element 45 by the die's cutting edges. This flexing is illustrated in a somewhat exaggerated manner in FIG. 3. The preferred manner of providing substrate 47 with reduced thickness is to form a recess 69 therein, said recess located along a surface (71) opposite to that surface of the substrate in which conductor 61 and switch 45 are pressed. As illustrated in FIG. 4, the end portion of switch 45 and part of conductor 61 are actually also pressed within the upper surface of reduced portion 67. Positioning of the recess within the underside (or bottom) of substrate 47 thus allows maintenance of a substantially undisturbed die-stamping plane to thereby facilitate production of the present invention.

Utilization of a flexing, reduced-in-thickness portion of substrate 47 results in the parallel edges 63 of each die reaching a different depth of penetration (dinking depth) within the substrate. Should a dinking depth (illustrated by dimension "a" in FIG. 4) of 0.004 inch be selected, the corresponding depth of the other, parallel edge (illustrated by dimension "b") will be less (e.g., by approximately 0.001 inch using the parameters described herein). Originally, substrate 47 possessed a thickness in its non-stamped regions of about 0.043 inch. Switching element 45 in turn possesses a thickness of about 0.001 inch while aluminum strip 55 possessed an original (prior to die-stamping) thickness of about 0.002 inch. In addition, element 45 possesses a hardness greater than that of the dead soft aluminum and also the preferred material for substrate 47, that being medium impact polystyrene. This material in turn possesses greater hardness and is less expensive than the material (high impact polystyrene) used in the substrate of application Ser. No. 131,711, filed Mar. 19, 1980. As stated, however, the instant invention is readily capable of utilizing the higher impact plastic and thus assure even greater results (e.g., less risk of switch cutting, die-stamping at greater distances from aperture 49, etc) than those obtained within application Ser. No. 131,711, filed Mar. 19, 1980. The preferred medium impact, high heat polystyrene used in the invention is available from the Amoco Chemicals Corporation, Chicago, Ill., and sold under the product designation M2RC7. A high impact, high heat polystrene capable of being successfully used for substrate 47 is also available from Amoco under the designation H4RC7.

From the above, it is understood that the proper selection of materials possessing the correct thicknesses and hardnesses is deemed critical to the invention. This selection, combined with the proper choice of die temperatures (should adhesives be used) and pressures and the unique provision of a flexure means, assures not only retention of the designated portion of switching element 45 within substrate 47 but also that the preselected portion 61 of aluminum strip 55, which is die-stamped within the substrate, will also be securedly retained and at the same time provide positive electrical contact with element 45. Contact is formed primarily at two locations, the first being at the extreme, substantially flattened edge 75 of the conductive member defined by portion 61, and the second along the common arcuate surface (boundary) 77 between portion 61 and element 45. As shown, the conductive member is also of substantially arcuate configuration with its extreme ends substantially tapered by the die-stamping procedure. This final configuration is due to the increased forces exerted along the outer, deeper penetrating edges 63 of the respective die, in comparison to forces exerted at its more recessed portions. As stated, the original thickness of the aluminum strip, prior to die-stamping of portions 61, was about 0.002 inch. Thicknesses substantially equal to or greater than switch 45 were successfully employed. In all instances, the thicknesses of both the aluminum strip 55 and the switch 45 were substantially less than the dielectric 47. In final, stamped form, conductive member 61 has a width (dimension "w") about 0.0625 inch. Part of member 61 lies atop (or covers) the embedded portion of switch 45, but said part is deemed of sufficient size so as to achieve the purposes intended. It is thus seen that the overlapping segment of conductive member 61 also serves to assist in retention of the embedded portion of switch 45. It is important to note that while edge 75 does achieve contact with switch 45, it does not deform or sever this element. Severance or even substantial deformation could render this portion of the circuitry inoperative. Much of the adhesive (51) which was originally applied to the bottoms of the ends of switch 45 pressed within substrate 47 will be forced out from under the switch during this operation but some (not shown) will remain to assist in retention. That adhesive material which is forced (or squeezed) out may settle within the recess 79 located under the non-covering portion of member 61. Thus, switch 45 provides a relief for this adhesive in the manner illustrated in FIG. 4.

As also shown in FIG. 2 another adhesive 81 is applied to the bottom of aluminum strip 55. The preferred adhesive is of the heat sensitive variety (several of which are well known in the art) and preferably possesses a quick reaction time. It can be applied directly to the bottom of strip 55 during manufacture thereof or can be provided in separate, sheet form. The adhesive has a thickness of about 0.0007 inch, and is activated during the die-stamping process by heating each of the top dies 57 and 57'. Preferred temperatures are within the range of about 325 to 400 degrees Farenheit. The bottom or base member 53 is not heated. In the stamping operation, the adhesive 81 engaging the common surface 77 will be substantially squeezed out into recess 79, thus assuring the described positive contact along this surface. It was found, however, that even if adhesive was to remain at this location, adequate electrical contact is still attained. Subsequent to this aforedefined stamping procedure, the upper platen 59 is withdrawn and remaining, selected non-stamped parts of aluminum strip 55 removed. Removal may be accomplished by hand or a suitable stripping tool (e.g., roller).

As an optional step, it may be desirable to engage predetermined (e.g., the uppermost) portions of the defined, stamped conductive member 61 with a heated die (not shown) in the event that the heat sensitive adhesive located immediately under these portions was not fully exposed to the elevated temperatures of dies 57 and 57'. It is understood that this is but an optional step and may only be desired for portions of the circuit board assembly's circuitry which will be subjected to great stress (e.g., insertion forces encountered during positioning of the finished devices 20 within the socket of a respective camera). This die could be heated to the same temperatures as those defined for dies 57 and 57'.

Figure 5:
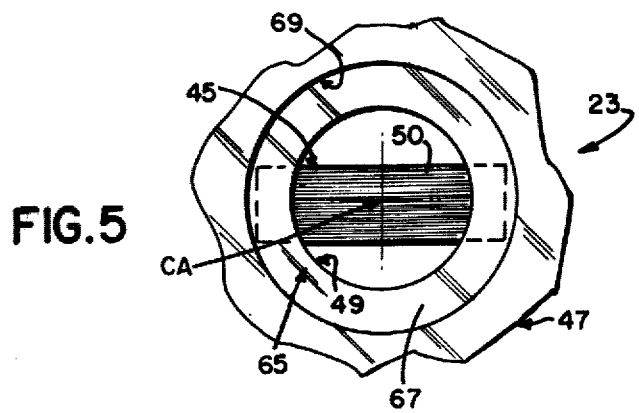
FIG. 5 is a partial bottom view of the assembly of FIG. 4 as taken along the line 5—5 in FIG. 4.
Figure 6:
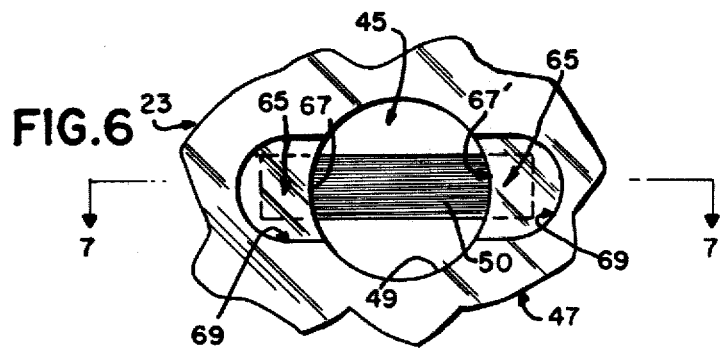
FIG. 6 is a partial bottom view of a circuit board assembly in accordance with an alternate embodiment of the invention.
Figure 7:
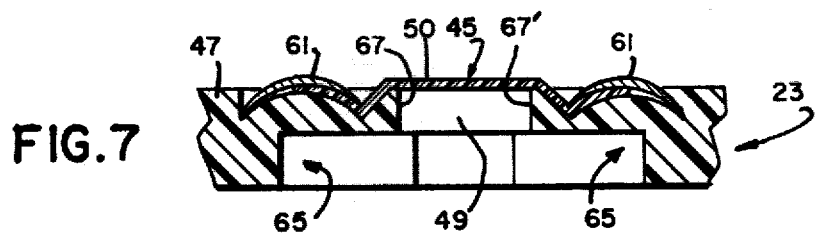
FIG. 7 is a partial elevational view, in section of the assembly of FIG. 6 as taken along the line 7—7 in FIG. 6.

With reference to FIG. 5, there is shown a partial bottom plan view of assembly 23 as seen along line 5—5 in FIG. 4. Recess 69 is illustrated therein as being of substantially cylindrical configuration and surrounding the smaller aperture 49, which is also of cylindrical configuration. More specifically, recess 69 is preferably concentrically oriented about aperature 49; that is, both are coaxially arranged such that their common axis CA (perpendicular to the drawing at point CA in FIG. 3) passes through the approximate geometric center of switching element 45 located on the opposite side of substrate 47 from recess 69. As shown, recess 69 is therefore a singular, continuous indentation within substrate 47. This arrangement differs from that in FIG. 6 wherein two separate, spaced-apart recesses 69 are employed within the bottom surface of substrate 47 on opposite sides of aperture 49. Each recess, being of substantially semicylindrical shape, is oriented such that it is aligned with a respective end of switching element 45 located on the opposite side of substrate 47. These ends are represented by hidden lines in both FIGS. 5 and 6. It is understood from the foregoing that the assembly of FIGS. 6 and 7 thus utilizes two separate portions 67 and 67' of reduced thickness located on opposite sides of aperture 49. Accordingly, the end portions of element 45 (and respective conductive members 61) are each pressed within an upper, first surface of a respective one of the reduced thickness portions. In both of the above embodiments, each recess is preferably of a depth of about one-half the thickness of substrate 47. By way of specific example, depths of from about 0.015 to about 0.025 inch were attained. As further shown in FIG. 7 (but also true for the embodiment of the invention depicted in FIGS. 4 and 5), both, opposing ends of switch 45 are pressed within substrate 47 and conductive members 61 located thereover and in electrical contact therewith. Members 61 are not shown in FIGS. 5 and 6 for reasons of clarity. As stated, a total of two members 61 are preferably used per element 45, with each located over only part of the respective pressed end portion (as in the embodiment of FIG. 4). It is seen in the drawings that members 61 are also oriented on opposite sides of aperture 49 by virtue of the bridging position of element 45.

Thus there has been shown and described a photoflash device and circuit board assembly for use therein wherein a flexure means is used to permit die-stamping of the assembly's circuitry without severance or extreme deformation of the assembly's switching elements, portions of which are also die-stamped. The invention permits use of harder materials for the substrate component than the assembly made in accordance with the technique defined in copending application Ser. No. 131,711, filed Mar. 19, 1981. The ability of the harder material to flex also permits die-stamping at greater distances from the substrate's aperture without fear of damaging the switching element. Larger switches and those of different configurations are thus possible, as well as the employment of smaller diameter switch apertures. All of the switch-conductor connections provided by the invention as described possessed a spark gap contact of less than about 500 volts, well within the acceptable range for high voltage lamp devices. Greater than ninety-nine percent of these exhibited a spark gap contact of less than 200 volts.

While there have been shown and described what are at present considered the preferred embodiments of the invention, it will be obvious to those skilled in the art that various changes and modifications may be made therein without departing from the scope of the invention as defined by the appended claims.

What is claimed is:

1. A circuit board assembly for use within a photoflash device, said circuit board assembly comprising:
   a dielectric substrate;
   a switching element positioned on said dielectric substrate and having a portion thereof pressed within said dielectric substrate;
   an electrically conductive member pressed within said dielectric substrate and having at least a part thereof located atop said pressed portion of said switching element and in electrical contact therewith; and
   flexure means located within said substrate or forming a part thereof for permitting said substrate to flex during pressing of said portion of said switching element and said conductive member within said substrate sufficiently to prevent severing of said switching element during said pressing.

2. The circuit board assembly according to claim 1 wherein said flexure means comprises a portion of reduced thickness formed within said dielectric substrate, said portion of said switching element and said conductive member being pressed within a first surface of said portion of reduced thickness.

3. The circuit board assembly according to claim 2 wherein said dielectric substrate includes an aperture therein, said switching element bridging said aperture, said portion of reduced thickness located adjacent said aperture.

4. The circuit board assembly according to claim 3 wherein said flexure means includes a recess in the dielectric substrate, said recess located adjacent a second, opposing surface to said first surface.

5. The circuit board assembly according to claim 4 wherein said aperture and said recess are each of substantially cylindrical configuration, the diameter of said recess being larger than the diameter of said aperature.

6. The circuit board assembly according to claim 5 wherein said aperture and said recess are coaxially oriented within said dielectric substrate.

7. The circuit board assembly according to claim 3 wherein said switching element includes a second portion thereof pressed within said dielectric substrate, said assembly further including a second electrically conductive member pressed within said dielectric substrate and having at least a part thereof located atop and in electrical contact with said pressed second portion of said switching element.

8. The circuit board assembly according to claim 7 wherein said second portion of said switching element and said second electrically conductive member are pressed within said portion of reduced thickness on an opposing side of said aperture from said pressed, first portion of said switching element and said first conductive member.

9. The circuit board assembly according to claim 7 wherein said flexure means further includes a second portion of reduced thickness formed within said dielectric substrate at a spaced-apart location from said first portion of reduced thickness, said second portion of said switching element and said second electrically conductive member being pressed within a first surface of said second portion of reduced thickness.

10. The circuit board assembly according to claim 9 wherein said second portion of reduced thickness is located adjacent said aperture on an opposing side thereof from said first portion of reduced thickness.

11. The circuit board assembly according to claim 10 wherein said flexure means includes first and second recesses in the dietectric substrate each of said recesses located adjacent a second opposing surface to said first surface.

12. The circuit board assembly according to claim 11 wherein said aperture is of substantially cylindrical configuration and each of said recesses is of a substantially semicylindrical configuration.

13. The circuit board assembly according to claim 1 wherein the material of said dielectric substrate is selected from the group consisting of medium impact polystyrene and high impact polystyrene.

14. The circuit board assembly according to claim 13 wherein the material of said switching element is selected from the group consisting of mono- or biaxially oriented polyethylene, polypropylene, polystyrene, polyester, or nylon.

15. The circuit board assembly according to claim 14 wherein the material of said conductive member is dead soft aluminum.

16. A photoflash device comprising:
a light-transmitting housing;
at least one electrically-activated flashlamp located within said housing for emitting high intensity light through said housing upon ignition thereof; and
a circuit board assembly located within said housing and including a dielectric substrate, at least one switching element positioned on said substrate and electrically connected to said flashlamp and having a portion thereof pressed within said substrate, an electrically conductive member pressed within said substrate and having at least a part thereof located atop said portion of said switching element and in electrical contact therewith, and flexure means located within said dielectric substrate or forming a part thereof for permitting said substrate to flex during pressing of said portion of said switching element and said conductive member within said substrate sufficient to prevent severing of said switching element during said pressing.

17. The photoflash device according to claim 16 wherein said dielectric substrate includes an aperture therein, said switching element bridging said aperture, said flexure means comprising a portion of reduced thickness formed within said dielectric substrate and located adjacent said aperture, said portion of said switching element and said conductive member being pressed within a first surface of said portion of reduced thickness.

18. The photoflash device according to claim 17 wherein said electrically-activated flashlamp includes a pair of conductive lead-in wires electrically connected to said switching element, said flashlamp being located within said housing substantially adjacent said aperture and said switching element.

19. The photoflash device according to claim 18 wherein said dielectric substrate further includes a recess therein located adjacent a second, opposing surface of said portion of reduced thickness on an opposing side of said dielectric substrate from said flashlamp.

20. The photoflash device according to claim 17 wherein said switching element includes a second portion thereof pressed within said dielectric substrate and said circuit board assembly further includes a second electrically conductive member pressed within said dielectric substrate and having at least a part thereof located atop said pressed second portion of said switching element.

21. The photoflash device according to claim 20 wherein said second portion of said switching element and said second electrically conductive member are pressed within said portion of reduced thickness on an opposing side of said aperture from said pressed, first portion of said switching element and said first conductive member.

22. The photoflash device according to claim 20 wherein said flexure means further includes a second portion of reduced thickness formed within said dielectric substrate at a spaced-apart location from said first portion of reduced thickness and located adjacent said aperture on an opposing side thereof from said first portion of reduced thickness, said second portion of said switching element and said second electrically conductive member being pressed within a first surface of said second portion of reduced thickness.

23. The photoflash device according to claim 22 wherein said electrically-activated flashlamp includes a pair of conductive lead-in wires electrically connected to said switching element, said flashlamp being located within said housing substantially adjacent said aperture and said switching element.

24. The photoflash device according to claim 23 wherein said flexure means includes first and second recesses in the dielectric substrate, each of said recesses located adjacent a second, opposing surface to said first surface.

* * * * *